United States Patent
Luo

(10) Patent No.: US 9,224,943 B2
(45) Date of Patent: Dec. 29, 2015

(54) FORMING METHOD OF AN ANNULAR STORAGE UNIT OF A MAGNETO-RESISTIVE MEMORY

(71) Applicant: Shanghai Huali Microelectronics Corporation, Pudong, Shanghai (CN)

(72) Inventor: Fei Luo, Shanghai (CN)

(73) Assignee: Shanghai Huali Microelectronics Corporation, Pudong, Shanghai (CN)

( * ) Notice: Subject to any disclaimer, the term of this patent is extended or adjusted under 35 U.S.C. 154(b) by 117 days.

(21) Appl. No.: 14/063,398

(22) Filed: Oct. 25, 2013

(65) Prior Publication Data

US 2014/0127832 A1 May 8, 2014

(30) Foreign Application Priority Data

Nov. 2, 2012 (CN) .......................... 2012 1 0432462

(51) Int. Cl.
*H01L 21/00* (2006.01)
*H01L 43/12* (2006.01)
*H01L 27/22* (2006.01)

(52) U.S. Cl.
CPC ............... *H01L 43/12* (2013.01); *H01L 27/228* (2013.01)

(58) Field of Classification Search
CPC ............................ H01L 21/3065; H01L 43/12
USPC ............................................................ 438/3
See application file for complete search history.

(56) References Cited

U.S. PATENT DOCUMENTS

| 2002/0020864 A1* | 2/2002 | Schwarzl .................... 257/295 |
| 2008/0078746 A1* | 4/2008 | Masuda .............. H01J 37/3244 216/79 |
| 2009/0206405 A1* | 8/2009 | Doyle et al. ................. 257/365 |
| 2010/0048024 A1* | 2/2010 | Sugimura .................... 438/702 |
| 2011/0306189 A1* | 12/2011 | Cheng et al. ................. 438/488 |
| 2012/0326251 A1* | 12/2012 | Yamakawa et al. .......... 257/421 |
| 2013/0008867 A1* | 1/2013 | Tokashiki et al. ............. 216/22 |

FOREIGN PATENT DOCUMENTS

| CN | 1495929 A | 5/2004 |
| CN | 102867913 A | 1/2013 |

* cited by examiner

*Primary Examiner* — Matthew Landau
*Assistant Examiner* — Igwe U Anya
(74) *Attorney, Agent, or Firm* — Albert Bordas, P.A.

(57) ABSTRACT

The present invention discloses a method of forming an annular storage structure of a magneto-resistive memory. It relates to the manufacturing process of the semiconductor devices. The method includes the following steps: a silicon oxide layer and a silicon nitride layer is formed on the thin-film layer of a magnetic channel junction; a circular silicon nitride trench is formed; a poly-silicon thin film is deposited to cover the silicon nitride trench, the annular poly-silicon structure is formed by plasma etching back; the remaining silicon nitride thin film is removed to form the annular poly-silicon hard mask; the poly-silicon hard mask is used when the magnetic channel junction thin film layer is etched by plasma etching. At last, the unit structure of magnetic channel junction is formed. The advantages of the above technical solutions are: the diameter of the round photo-resist pattern is larger; it is possible to use the photo-etching with normal resolution, thus the method reduces the cost of production enhances market competitiveness and obtains significant economic benefits.

6 Claims, 4 Drawing Sheets

FORMING METHOD OF AN ANNULAR STORAGE UNIT OF A MAGNETO-RESISTIVE MEMORY

CROSS-REFERENCE TO RELATED APPLICATIONS

The present application claims priority under the Paris Convention to Chinese application number CN 201210432462.1, filed on Nov. 2, 2012, the disclosure of which is herewith incorporated by reference in its entirety.

FIELD OF THE INVENTION

The present invention relates to a semiconductor device manufacturing process, in particular it relates to a forming method of an annular storage unit of a magneto-resistive memory.

BACKGROUND OF THE INVENTION

A magneto-resistive random access memory is a kind of non-volatile memory device, which possesses an advantage of comparable speed in data read/write regarding to a static random access memory. Its storage density is also similar to that of a static random access memory. One more attractive feature of a magneto-resistive random access memory is that it is almost free of reliability problem caused by the deterioration of device. It is called a versatile memory for its various advantages and it is capable of fully replacing the current applications of the static/dynamic random access memory and the flash memory.

It is different from the principle of a static/dynamic random access memory or a flash memory that a magneto-resistive random access memory stores information by a magnetic storage structure instead of the holding and releasing charges.

As shown in FIG. 1, a magnetic storage structure consists of two ferromagnetic plate electrodes, which are separated by a layer of insulating film. The "sandwich" structure is called a magnetic channel junction. Concerning the two magnetic electrodes in the magnetic channel junction, one electrode which is of a fixed magnetic field direction is called a fixed layer and the other electrode whose magnetic field direction changes with the external magnetic field is called a changeable layer. When the magnetic field direction of the changeable layer is as same as the fixed layer, the resistance of the entire magnetic channel junction becomes very small and the current flowing through the magnetic channel junction will be very large under the effect of an applied voltage. When the magnetic field direction of changeable layer is opposite to the direction of the fixed layer, the resistance of the entire magnetic channel junction becomes very large and the current flowing through the magnetic channel junction current will be very small under the effect of an applied voltage. The signal identification can be achieved by observing the change of current.

As shown in FIG. 2, the three-dimensional structures of two common magnetic channel junctions are introduced. The structure in the left part of the figure is a flat square structure and the right part of the figure shows an annular structure. In comparison with the magnetic channel junction with a flat square structure, the magnetic channel junction with an annular structure has a better access feature and it has become a consistently applied structure in the current semiconductor industry. However, in the manufacture, the process of the magnetic channel junction with an annular structure is more complicated and the manufacturing cost will be higher. A magnetic channel junction with an annular structure has two diameters, for the inner side and the outer side. As the diameter of the inner side is usually very small, high resolution will be required for the exposure apparatus in the manufacturing process. However, the adoption of advanced exposure apparatus will increase the manufacturing cost significantly. Currently, it is a popular topic on how to manufacture an annular magnetic channel junction which has precise dimensions under the condition that the high-resolution exposure apparatus is not used.

Chinese patent (CN 1495929A) has disclosed a method of manufacturing a magneto-resistive memory. In the method disclosed, a multilayer film is formed by sequentially forming a titanium layer, a titanium nitride layer and an aluminum layer on an insulating film. Then a photo mask pattern is formed. An annular magnetic layer is formed by etching with boron trichloride as reaction gas. The annular structure in the patent is formed by one-time photoetching and one-time etching, so the exposure apparatus in the manufacturing process is with high resolution ratio requirement.

Chinese patent (CN 102867913A) has disclosed a method of forming an annular storage unit of a magneto-resistive memory. Firstly, the periphery of a cylinder structure polysilicon is metalized by a metallic silicide process. Secondly, the polysilicon on the inner side of the metal silicide is removed to get an annular hard mask of metal silicide. Finally, the hard mask is used to etch the thin film layer of the magnetic channel junction to get an annular storage unit with precise dimensions which is applied to a magnetic memory. The patent provides a method of manufacturing an annular magnetic channel junction with precious dimensions without high-resolution exposure apparatus.

SUMMARY OF THE INVENTION

Due to the defects in the prior art, the present invention provides a method of forming an annular storage unit of a magneto-resistive memory, which is detailed introduced as follows:

A method of forming an annular storage unit of a magneto-resistive memory, which is applied to a magneto-resistive random access memory, wherein the said method comprises the following steps:

Step 1: a thin-film layer of magnetic channel junction is deposited on a wafer substrate; then a silicon oxide layer and a silicon nitride layer are formed on the thin-film layer of the said magnetic channel junction;

Step 2: a photo-resist pattern is defined on the silicon nitride layer by photoetching process; the top view of the said photo-resist pattern is a circular groove, and the diameter of the said circular groove ranges from 40 nm to 200 nm;

Step 3: the said silicon nitride layer is etched, and the said etching process stops at the said silicon oxide layer below the said silicon nitride layer, then the remaining photo-resist is removed to form a circular silicon nitride trench;

Step 4: a poly-silicon thin film is covered on the surface of the wafer to form a poly-silicon layer, and the said polysilicon layer is performed plasma etching back; the etching process stops at the said nitride layer, and an annular polysilicon structure is formed on the sidewalls of the said silicon nitride trench;

Step 5: the remaining silicon nitride layer is removed by etching, and the etching process stops at the said silicon oxide layer below the said silicon nitride layer; only the said annular polysilicon structure remains on the surface of the wafer after etching;

Step 6: the said polysilicon structure formed in Step 5 is used as a hard mask while the said underlying thin-film layer of a magnetic channel junction is etched with dry plasma etching to form the annular structure of the magnetic channel junction.

According to the above method, wherein the said silicon nitride layer is etched by dry plasma etching in Step 3.

According to the above method, wherein a poly-silicon layer covers on the surface of the wafer by low-pressure chemical vapor deposition process in Step 4.

According to the above method, wherein the remaining silicon nitride layer is removed by plasma etching or wet etching in Step 5.

According to the above method, wherein the thickness of the polysilicon thin films at the bottom, on the sidewall and on the top of the said silicon nitride trench are identical in Step 4.

According to the above method, wherein the outer diameter of the said polysilicon is determined by the diameter of the said silicon nitride trench.

According to the above method, wherein the inner diameter of the said polysilicon is determined by the thickness of the said polysilicon thin film.

The beneficial effects of the above technical solution are: the above process and method are used to form a circular photo-resist pattern with a argon fluoride mask aligner with normal resolution. An annular structure of magnetic tunnel junction is finally formed accordingly. The method reduces the cost of production, enhances market competitiveness and obtains significant economic benefits.

DETAILED DESCRIPTION OF THE PREFERRED EMBODIMENT

The present invention will be further illustrated in combination with the following figures and embodiments, but it should not be deemed as limitation of the present invention.

FIGS. 3A to 3F show the detailed process of forming the structure of the magnetic channel junction in an embodiment of the present invention.

Figure 1:
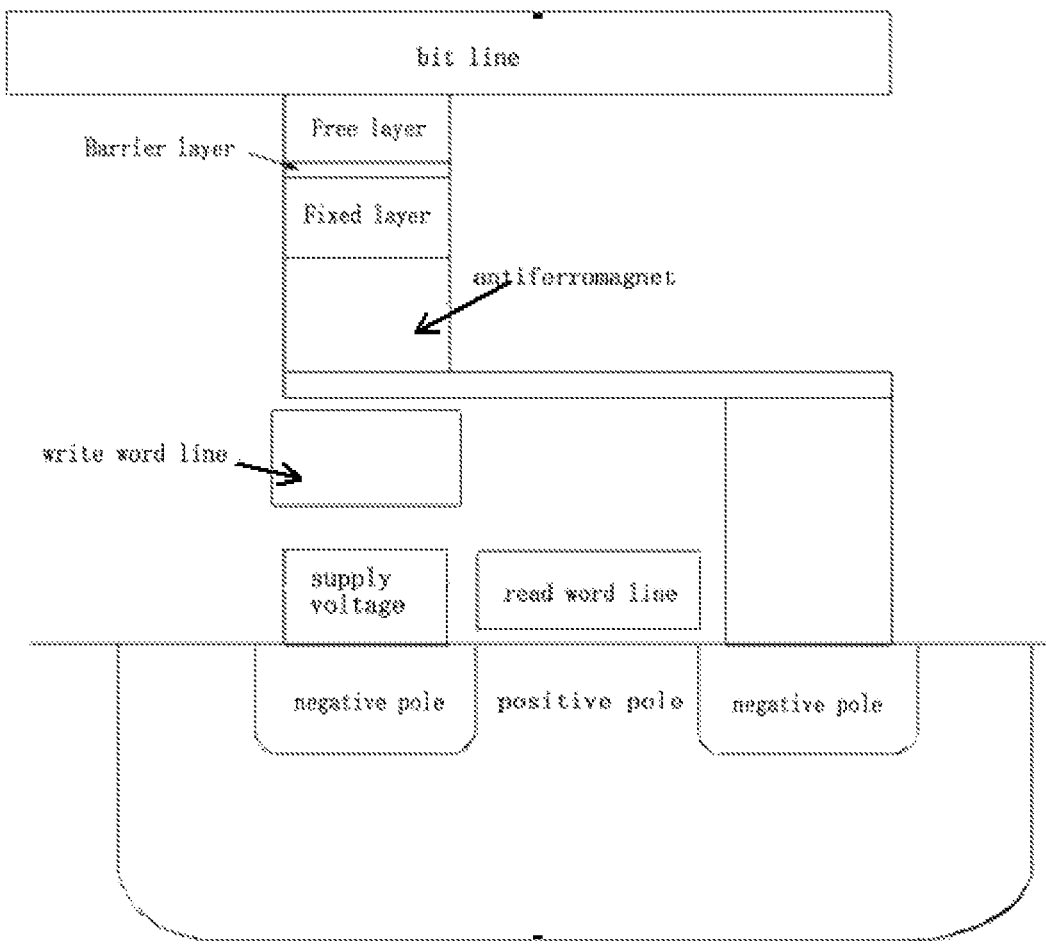
FIG. 1 is a schematic diagram of the basic storage structure of the magneto-resistive memory in the prior art.
Figure 2:
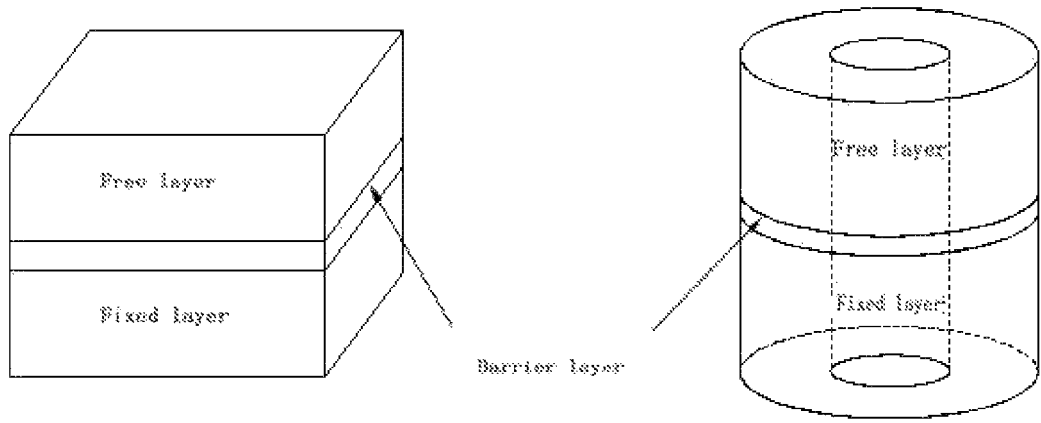
FIG. 2 is a schematic diagram of the three-dimensional structure of the two types of magnetic channel junction in the prior art.
Figure 3A:
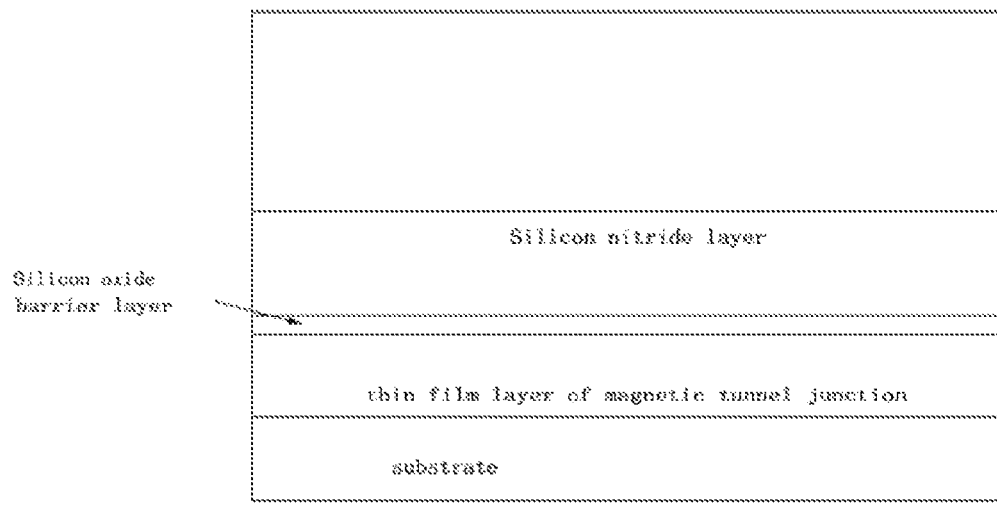
FIGS. 3A to 3F show the process of forming the annular structure of the magnetic channel junction in an embodiment of the present invention.

As shown in FIG. 3A, a magnetic channel junction thin film layer is deposited on the substrate of the wafer by chemical vapor deposition. A silicon oxide layer of 3-10 nm is formed on the magnetic channel junction thin film layer, which has been chosen as 5 nm in the present embodiment. Moreover, a silicon nitride layer of 10-300 nm is formed on the magnetic channel junction thin film layer, whose thickness has been chosen as 100 nm in the present embodiment. The said silicon nitride layer can be selectively a silicon oxy-nitride film, a silicon oxy-carbide film, a silicon carbide film or a composite layer of these films.

Figure 3B:
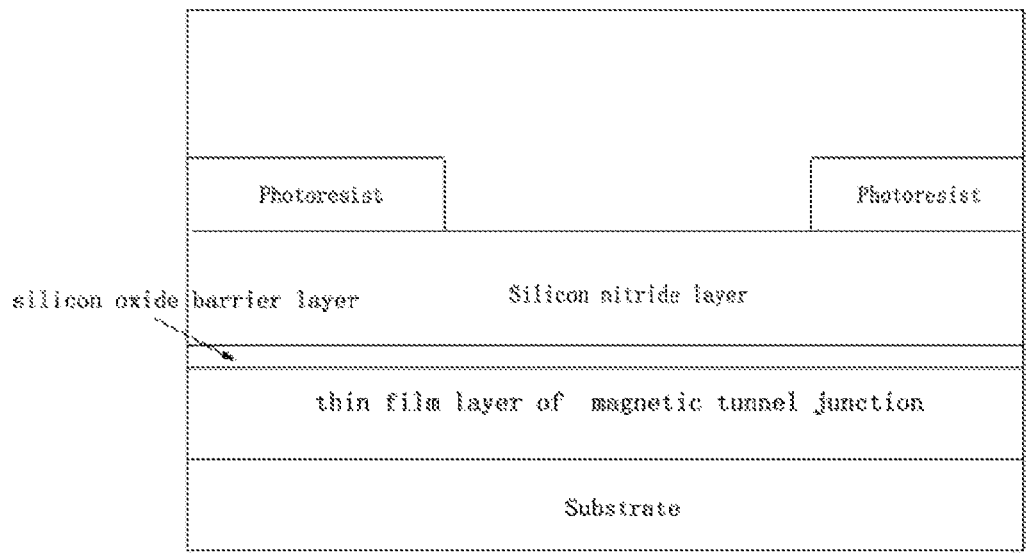

FIG. 3B shows the photo-etching process. The 90 nm design rule has been taken as an example in the embodiment. The photo-resist pattern used to form the annular structure of magnetic channel junction is a circular pattern instead of an annular pattern. The outer diameter of the circular pattern meets the design dimension requirement. The diameter of the circular pattern is larger, which ranges from 40 nm to 200 nm. It has been chosen as 90 nm in the embodiment of the present invention. The pattern with the critical dimensions can be formed by a low-resolution photo-etching argon fluoride mask aligner.

Figure 3C:
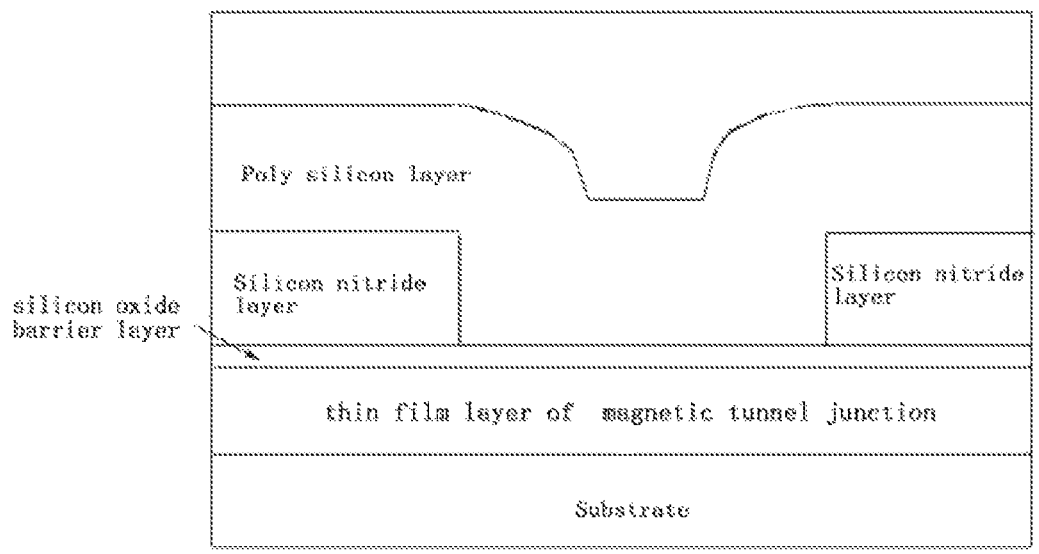

As shown in FIG. 3C, the silicon nitride layer is etched by dry plasma etching to form the silicon nitride trench. The specific etching condition is according to the industrial standard plasma etching process. The etching stops at the silicon oxide layer below the silicon nitride layer and the silicon oxide layer is exposed. The remaining photo-resist is removed to form the circular silicon nitride trench. Then a thin layer, such as the poly-silicon layer, with good step coverage is deposited through chemical vapor deposition, physical vapor deposition or atomic layer deposition. The thickness of the thin layer is 10-300 nm. And 26 nm has been chosen in the embodiment of the present invention. The good step coverage property of the poly-silicon layer can ensure the thickness of the poly-silicon thin film on the bottom side, on the sidewall and on the upside of the silicon nitride trench be substantially identical. The poly-silicon layer can be replaced by a silicon oxide film, a titanium nitride film or a tantalum nitride film.

Figure 3D:
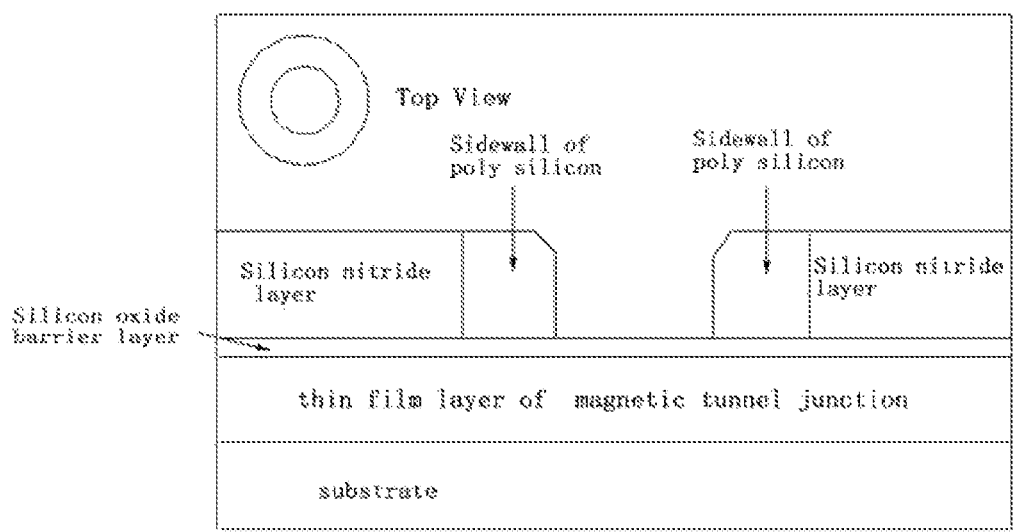

As shown in FIG. 3D, the covering poly-silicon layer is performed with plasma etching back, the etching conditions are also according to the industrial standard plasma etching process. When the poly-silicon at the surface of the silicon nitride layer trench is removed and only the polycrystalline silicon thin film on the trench sidewalls remains, the etching stops. As a result, the annular structure of poly-silicon structure is formed on the sidewalls of the silicon nitride trench. In the present embodiment, the thickness of the annular structure is chosen as 25 nm.

Figure 3E:
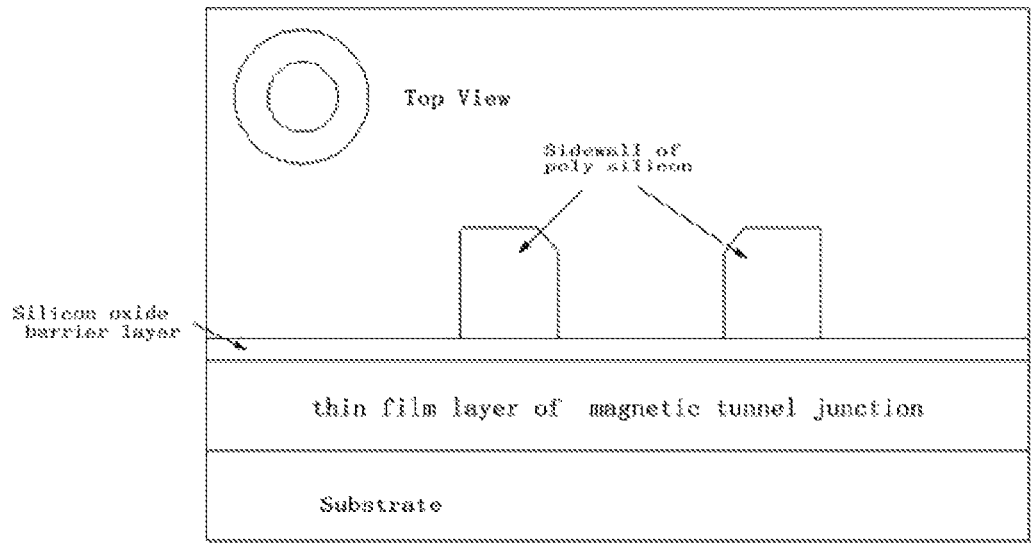

As shown in FIG. 3E, the remaining silicon nitride layer is removed by plasma etching or wet etching, and the etching stops at the silicon oxide layer below the silicon nitride layer. The silicon oxide film layer is used as an etching barrier layer. The wet etching process is used in the embodiment of the present invention, the chosen chemical solution is hot phosphoric acid of 160° C. or other chemical solutions which have high etching selectivity ratio to silicon oxide and silicon nitride. The time of processing lasts 25 minutes. As the underlying silicon oxide layer has good resistance property against the wet etching, the underlying film of the magnetic channel junction will not be damaged when the silicon nitride layer is removed completely. Thereafter, the outer diameter of the annular poly-silicon structure is determined by the diameter of silicon nitride trench, and the inner diameter of the annular poly-silicon structure is determined by the thickness of poly-silicon thin film. In the embodiment of the present invention, the pattern of the annular poly-silicon structure remained on the surface of wafer is 100 nm in height, 40 nm in inner diameter and 90 nm in outer diameter.

Figure 3F:
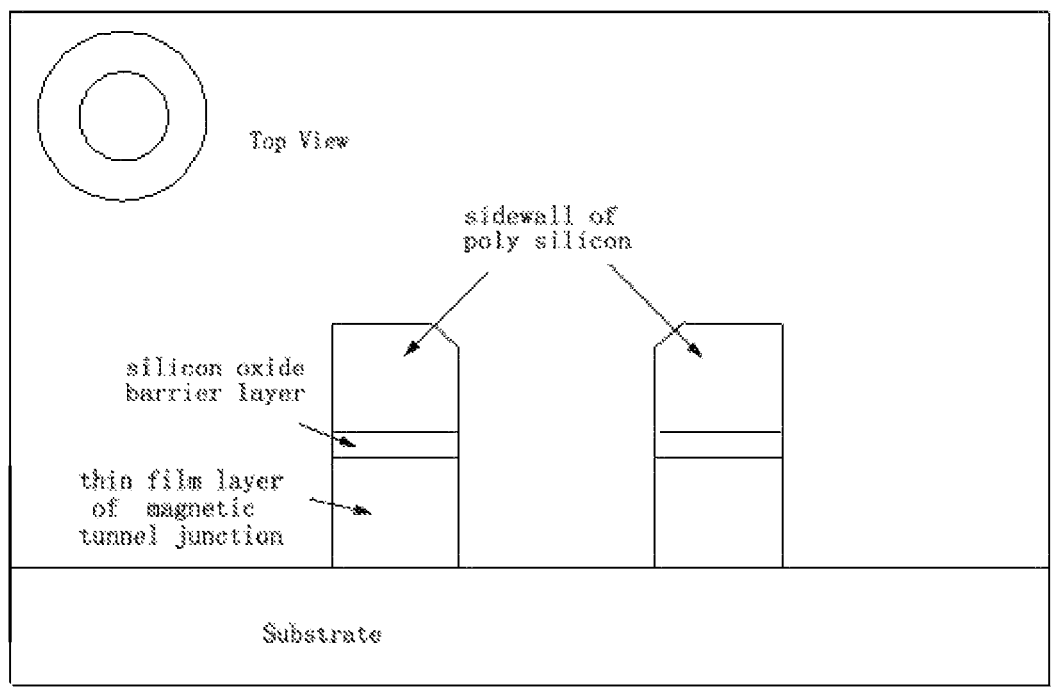

At last, as shown in FIG. 3F, the underlying magnetic channel junction thin film layer is etched by wet etching or plasma dry etching with the hard mask which the annular poly-silicon structure shown in FIG. 3E acts as. After the etching, the annular poly-silicon structure of the magnetic channel junction is formed with the inner diameter of 40 nm and the outer diameter of 90 nm.

The above description is only the preferred embodiments of the present invention, which should not be deemed as limitation of the implementing and the scope of protection. It is obvious for the skilled in the art to make varieties and modifications after reading the above descriptions as well as all the changed and modified solutions which are achieved easily based on the specifications and drawings of this inven-

The invention claimed is:

1. A method of forming an annular storage unit of a magneto-resistive memory, which is applied to a magneto-resistive random access memory, wherein said method comprises the following steps:

Step 1: a thin-film layer of magnetic channel junction is deposited on a wafer substrate; then a silicon oxide layer and a silicon nitride layer are formed on the thin-film layer of said magnetic channel junction;

Step 2: a photo-resist pattern is defined on the silicon nitride layer by photoetching process; the top view of said photo-resist pattern is a circular groove, and the diameter of said circular groove ranges from 40 nm to 200 nm;

Step 3: said silicon nitride layer is etched, and said etching process stops at said silicon oxide layer below said silicon nitride layer, then remaining photo-resist is removed to form a circular silicon nitride trench;

Step 4: a poly-silicon thin film with good step coverage property is covered on the surface of the wafer to form a poly-silicon layer, and a plasma etching-back is performed on the poly-silicon layer; the etching process stops at said silicon nitride layer, and an annular poly-silicon structure is formed on the sidewalls of said silicon nitride trench, in the step of forming the poly-silicon layer, the thickness of the poly-silicon thin film covered on the bottom side, on the sidewall and on the upside of the circular silicon nitride trench is substantially identical;

Step 5: the remaining silicon nitride layer is removed by etching, and the etching process stops at said silicon oxide layer below said silicon nitride layer; only said annular poly-silicon structure remains on the surface of the wafer after etching;

Step 6: said poly-silicon structure formed in Step 5 is used as a hard mask while said underlying thin-film layer of a magnetic channel junction is etched with dry plasma etching to form the annular structure of the magnetic channel junction.

2. The method according to claim 1, wherein said silicon nitride layer is etched by dry plasma etching in Step 3.

3. The method according to claim 1, wherein the surface of the wafer is covered by a poly-silicon layer which is formed by low pressure chemical vapor deposition in Step 4.

4. The method according to claim 1, wherein the remaining silicon nitride layer is removed by plasma etching or wet etching in Step 5.

5. The method according to claim 1, wherein the outer diameter of said poly-silicon is determined by the diameter of said silicon nitride trench.

6. The method according to claim 1, wherein the inner diameter of said poly-silicon is determined by the thickness of said poly-silicon thin film.

* * * * *